(12) United States Patent
Shuey

(10) Patent No.: US 7,772,812 B2
(45) Date of Patent: Aug. 10, 2010

(54) SYSTEM AND METHOD FOR PROVIDING A DC VOLTAGE SOURCE WITHIN A POWER METER

(75) Inventor: Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 257 days.

(21) Appl. No.: 12/218,925

(22) Filed: Jul. 17, 2008

(65) Prior Publication Data

US 2010/0014332 A1   Jan. 21, 2010

(51) Int. Cl.
  G05F 1/613   (2006.01)
  G05F 1/40    (2006.01)
(52) U.S. Cl. ........................................ 323/224; 323/271
(58) Field of Classification Search ......... 323/223–226, 323/229, 268, 270, 271, 273–275, 282, 284, 323/285; 363/17–98, 132
See application file for complete search history.

(56) References Cited

U.S. PATENT DOCUMENTS

| | | | | |
|---|---|---|---|---|
| 5,973,941 A * | 10/1999 | Zaim | ........................ | 363/21.08 |
| 7,180,282 B2 * | 2/2007 | Schleifer | .................... | 324/142 |
| 7,359,221 B2 * | 4/2008 | Knill | ........................ | 363/21.12 |

* cited by examiner

Primary Examiner—Matthew V Nguyen
(74) Attorney, Agent, or Firm—Woodcock Washburn LLP

(57) ABSTRACT

A power meter for measuring power consumption and detecting the presence of an unsafe line condition is disclosed. The power meter has a service disconnect switch, which is interposed between load contacts and source contacts, the disconnect switch interrupts the flow of power from the source contacts to the load contacts when the disconnect switch is in an open position. The power meter also has a processor coupled to a two input signal processing circuit. The two input signal processing circuit receives a first and second voltage signal from the load contacts. The two input signal processing circuit converts the first and second voltage signal into a first and second voltage value. The processor computes the power consumption using the first and second voltage values in combination with current values. The processor uses the first or second voltage valuea to determine the presence of an unsafe line condition when either the first or second voltage value exceeds a first voltage threshold or the first or second voltage value is below a second voltage threshold when the service disconnect switch is in the open position.

25 Claims, 4 Drawing Sheets

SYSTEM AND METHOD FOR PROVIDING A DC VOLTAGE SOURCE WITHIN A POWER METER

FIELD OF INVENTION

The present invention relates generally to power systems, and more particularly to a system and a method for providing a DC voltage source within a power meter.

RELEVANT BACKGROUND

Utility companies use power meters to regulate and monitor power usage. Early power meters were electromechanical in nature converting the flow of electricity through the power meter into mechanical movement. The mechanical movement was used to turn a recording device which recorded the amount of energy being used. As technology improved over the years, the design of the power meter incorporated new innovations such as increased processing capability within the meter, elimination of mechanical parts, better accuracy and the like.

The power meter typically monitors and measures the amount of power that the utility consumer uses. Additionally, the utility meter may monitor the real time conditions that exist at the utility customer's site. Within the power meter, internal circuitry such as processors, microprocessors, microcontrollers or the like may perform these monitoring functions. In order to operate, the internal circuitry may require a DC (direct current) power supply.

Within the power meter, the DC power supply may connect directly to the utility lines that couple the utility meter to the power grid. Under normal operating conditions, the power meter may experience voltage ranging from about 70 VAC to about 288 VAC. The DC power supply converts the AC voltages to a constant DC voltage. The converted DC voltage typically ranges between 3 VDC to about 12 VDC. In addition to converting the AC voltages to a DC voltage, the power meter must be able to withstand surges in the AC voltage. Occasionally, the utility lines may experience large surges in voltage due to lightning strikes or other over voltage conditions. In order to provide a constant DC voltage as well as over voltage protection, the DC power supply may contain a multitude of discrete components. In previous power meters, the discrete components of the DC power supply required significant space on the power meter's circuit board. Some discrete components contained within the power meter's internal circuitry may include a 60 Hz transformer, various inductors, capacitors, resistors and transformers or the like.

As technology has advanced, the characteristics of many of the discrete components began to evolve. In previous power meters, a dedicated discrete inductor is used as an energy storage unit to provide voltage into a switching voltage regulator. Thus when the AC voltage dropped below a particular voltage threshold, the discrete inductor discharged and continued to provide voltage to the switching regulator until the incoming AC waveform returned to the voltage threshold.

SUMMARY

There exists a need in the industry to provide the same functionality of the previous switching DC power supplies while improving the efficiency and cost effectiveness of the meter design. The present disclosure addresses this need and discloses such a power meter. The present invention takes advantage of the inherent inductive characteristics of a voltage transformer and eliminates some of the discrete components necessary in the previous meter designs. The inherent inductive characteristics of the present invention provide the energy storage for a power meter's DC power supply when the input into the voltage transformer drops a predetermined voltage threshold.

A DC power supply for a power meter is disclosed. The DC power supply has a transformer, the transformer has an input and an output, the input receives a first AC (alternating current) voltage waveform and converts the first AC voltage to a second AC voltage. The transformer also has an internal impedance; the internal impedance further has an inductive portion. The output of the transformer is coupled to a diode bridge, the diode bridge rectifies the second ac voltage into a rectified AC voltage. The diode bridge is coupled to a first switching transistor circuit which is biased to turn on when the rectified AC voltage is greater than a first voltage threshold and turn off when the rectified AC voltage is less than the first voltage threshold. The diode bridge also coupled to a second switching transistor circuit the second switching transistor circuit is biased to turn off then the rectified AC voltage is above the first voltage threshold and turn on when the rectified AC voltage is below the first voltage threshold. The power supply also has a switching regulator circuit, the switching regulator circuit provides a DC power source, the switching regulator circuit receives energy from the inductive portion when the rectified AC voltage is below the first voltage threshold and the second transistor circuit is on.

A method for supplying a DC (direct current) power source for a power meter is disclosed. The method transforms a first AC voltage to a second AC voltage by using a transformer. The transformer has an internal inductance. The method further rectifies the second AC voltage into a rectified AC voltage by using a rectifying circuit. The method receives the rectified AC voltage at a first switching transistor circuit and, the method also receives the rectified AC voltage at a second switching transistor circuit. The method further receives the rectified AC voltage at a switching regulator circuit. The method turns the first switching transistor circuit on and turns the second switching transistor circuit off when the rectified AC voltage transitions above a voltage threshold. The method turns the first switching transistor circuit off and turns the second switching transistor circuit on when the rectified AC voltage transitions below the voltage threshold. The method also sources energy from the internal inductance into the switching regulator when the rectified voltage is below the voltage threshold.

A more complete understanding of the present invention, as well as further features and advantages of the invention, will be apparent from the following detailed description and the accompanying drawings.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention. For ease of illustration, all alternating current (AC) voltage values are represented in terms of root mean squared (RMS) values unless otherwise specified.

Figure 1:
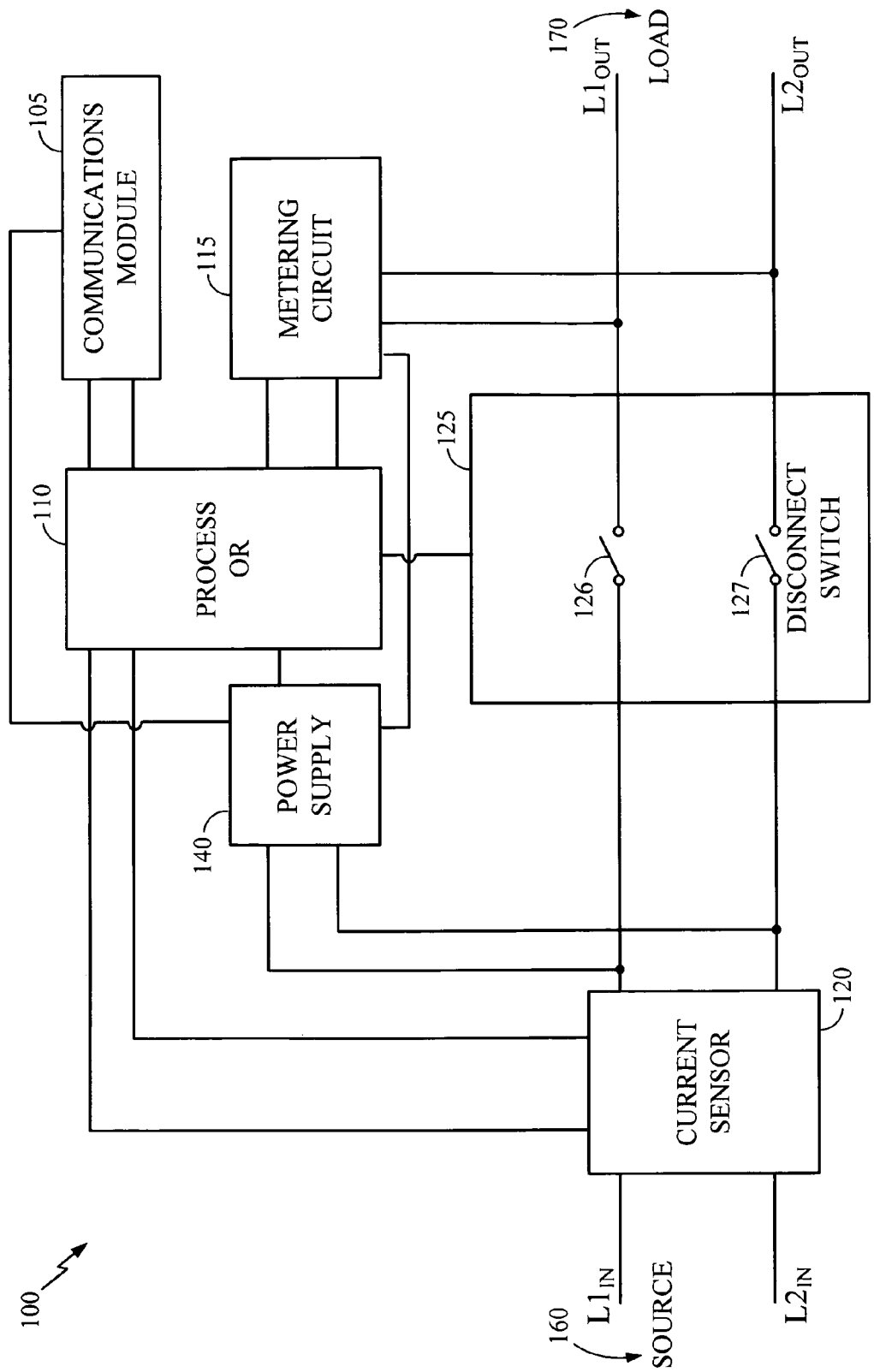
FIG. 1 displays a 2 S single phase two element two wire power meter in accordance with another embodiment of the present invention.

FIG. 1 displays a power meter 100 similar to a 2 S single phase two wire, two element watt-hour meter. Those skilled in the art will recognize that the power meter 100 can be installed to measure power in a conventional 120/240 split phase electric system and in this configuration there is no neutral connection brought into the power meter 300. Within the power meter 100, a processor 110 is coupled to a current sensor 120, a communications module 105, a metering circuit 115, and a service disconnect switch 125. Providing a direct current (DC) power to the processor 110, the communications module 105, the metering circuit 115 as well as any other discrete logic circuitry in the power meter 100 is a power supply 140. The power supply 140 provides a DC voltage necessary for the processor 110 and other connected circuitry to operate. As is explained in greater detail in subsequent sections, the power supply 140 receives an AC waveform and converts it to a DC voltage. In one embodiment of the present invention, the DC voltage is about 3.3 VDC.

The power meter 100 is designed to receive a source voltage at $L1_{IN}$ and $L2_{IN}$ at the source side 160 of the power meter 100. The source voltage may be provided from the utility power grid, typically from a transformer near the subscriber site. The source voltage received at the source side 160 of the power meter 100 typically ranges between 0 and about 280 VAC, but must be able to withstand higher voltages in certain over voltage conditions. In addition, the power meter 100 may be designed to receive an AC voltage waveform that oscillates at 50 HZ (typical for European voltages) or 60 HZ (typical for North American power applications).

Within the power meter 100 the electrical power is routed through a current sensor 120. The current sensor 120 measures the amount of current flowing through each source side contact ($L1_{IN}$ and $L2_{IN}$) of the power meter 100. Coupled to the current sensor 120 is a service disconnect switch 125. Power is supplied to the load side 170 of the power meter 100 through the service disconnect switch 125 when the service disconnect switch 125 is closed. From the service disconnect switch 125, power is routed to the consumer via the load side contacts $L1_{out}$ and $L2_{out}$.

The processor 110 is coupled to the service disconnect switch 325 and may open or close the service disconnect switch 325 by opening and closing an electromechanical solenoid switch which moves the moveable contacts 326 and 327. Opening and closing the service disconnect switch 325 allows the processor 110 to connect or disconnect the consumer from the power grid. Power is supplied to the consumer when the service disconnect switch 325 is closed (the movable contacts 326 and 327 are engaged) via the load side 170 contacts $L1_{OUT}$ and $L2_{OUT}$.

Also communicating with the processor 110 is a metering circuit 115. The metering circuit 115 is coupled directly to the load side contacts $L1_{OUT}$ and $L2_{OUT}$ and the source side contact $L2_{IN}$. Within the metering circuit 115 is a signal processing circuit which measures the voltage levels at the line side contacts $L1_{OUT}$ and $L2_{OUT}$ with respect to the source side contact $L2_{IN}$. Those skilled in the art will recognize that the Form 2 S meter configuration does not include a connection to neutral or earth ground. The metering circuit 115 monitors the voltage levels present at the load side 170 of the service disconnect switch 325.

Figure 2:
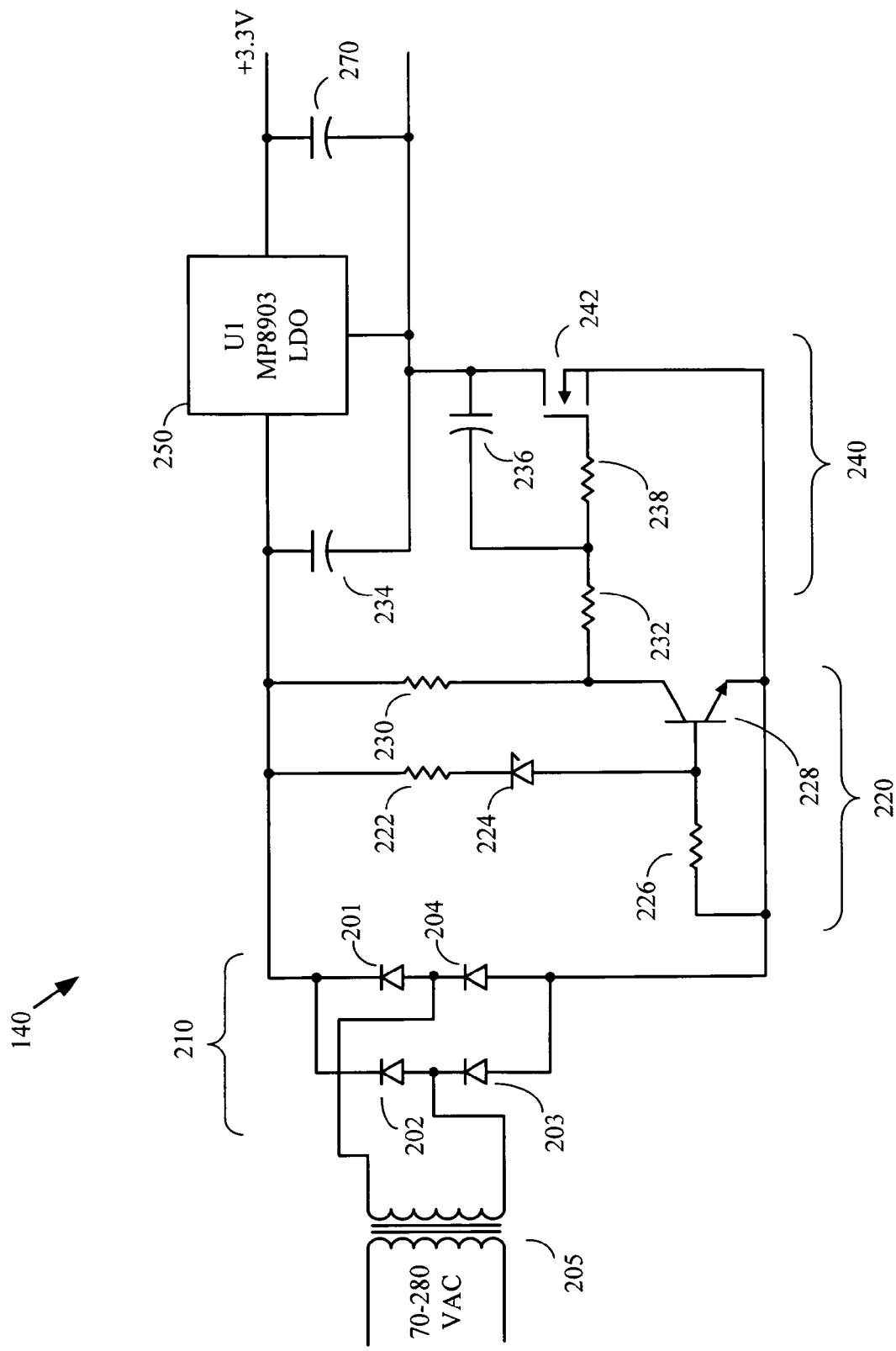
FIG. 2 displays a DC power supply circuit in accordance to one embodiment of the present invention used by the power meter of FIG. 1.

FIG. 2 displays a schematic diagram of an exemplary power supply 140 in accordance with one embodiment of the present invention. The power supply 140 receives the AC voltage at a transformer 205. In one embodiment, the transformer 205 may be a 60 HZ transformer capable of receiving voltage ranging between about 70 VAC and 280 VAC. In this embodiment, the transformer 205 may step the voltage down at a ratio of about 11:1. If the transformer 205 receives a 70 VAC waveform at its input, the maximum output voltage from the secondary winding of the transformer 205 may be about 8.0 VAC. Similarly, if a 120 VAC or a 240 VAC voltage is received at the primary winding of the transformer 205, the output will be about 4.5 VAC and about 9 VAC respectively.

The output of the transformer 205 is directed to a diode bridge 210 comprising diodes 201, 202, 203, and 204. As those skilled in the art appreciate, the diode bridge 210 rectifies the stepped down AC voltage wave form. The full wave rectified voltage is in turn provided to two switching transistors circuits 220 and 240 as well as a low drop out (LDO) voltage regulator 250. The LDO 250, using load filter capacitor 270 provides the DC voltage to the processor and the other connected circuitry used by these circuits to operate. In one exemplary embodiment, the LDO 250 may provide a 3.3 VDC, 35 mA power source to the processor and connected circuitry. During the AC transitions when the full wave rectified voltage provided to the input of the LDO 250 drops below about 6.0 VDC, the switching transistor circuits 220 and 240 provide a means for keeping the input voltage into the LDO at or above about 6.0 VDC.

Within the switching transistor circuit 220, resistor 222 is coupled to the output of the transformer 205. The resistor 222 is also coupled with a Diode 224. The diode 224 is connected to the base of a NPN bipolar junction transistor (BJT) 228. Also connected to the base of the BJT 228 is resistor 226. Connected to the collector of the transistor 228 is resistor 230. Resistor 230 is also connected to the output of the transformer 205. The combination of resistor 222, diode 224 and resistor 226 bias the transistor 228 to turn on and remain on when the rectified AC voltage is at or above about 6.0 VDC. In one embodiment, resistor 222 may be a 20 kΩ ½ watt resistor, resistor 226 may be a 30 kΩ ½ watt resistor, and resistor 230 may be a 47 kΩ ½ watt resistor. The diode 224 may have a breakdown voltage of about 5.6V.

As is explained in subsequent sections, when the rectified voltage is above this threshold (about 6.0 VDC), switching transistor circuit 240 is off while switching transistor circuit 240 is on, and there is no charging current supplied to capacitor 234. In the previous example, the threshold is determined by the breakdown voltage of the diode 224 and the base to emitter voltage (about 0.4V) which is about 6.0V.

In one embodiment, the capacitor 234 may be a 470 μF, 10V capacitor. During this period, the capacitor 234 is supplying the voltage directly to the LDO 250. Thus, while the rectified voltage is above the previously mentioned threshold, power into the input of the LDO 250 is provided directly from the rectified AC waveform via capacitor 234.

However, as the rectified voltage waveform drops below the predetermined threshold, the input into the LDO 250 needs to remain above about 4.0V in order for the LDO 250 to provide an output of about 3.3 VDC. In one embodiment, switching transistor circuit 220 is switched off and switching transistor circuit 240 is switched on when the rectified voltage drops below about 6.0V. When this happens, energy stored within the power supply 140 is used to provide the LDO 250 with sufficient input voltage to keep its output at about 3.3 VDC. In one embodiment of the present invention, the internal impedance of the transformer 205 acts as a storage element and supplies the energy required to keep the input into the LDO 250 at or above 4.0V. In this embodiment, when the rectified voltage transitions through the predetermined threshold, the internal impedance, and more specifically the internal inductance in the transformer 205 provides the stored energy used to supply the LDO 250. When the switching transistor circuit 240 is on, current flows from the internal inductance through capacitor 234. The current supplied by the internal inductance is sufficient to charge capacitor 234 and provide voltage to the LDO 250. In this instance, capacitor 234 filters the input voltage into the LDO 250 when the rectified voltage drops below the predetermined threshold.

When the rectified voltage drops below the predetermined threshold, the first switching transistor circuit 220 turns off and the second switching transistor circuit 240 turns on. The second switching transistor circuit 240 comprises a transistor 242, capacitor 236, and resistors 232 and 238. In this embodiment transistor 242 is a 50V MOSFET (metal oxide semiconductor field effect transistor). Those of sufficient skill in the art appreciate that when the transistor 228 of the first switching transistor circuit turns off, the voltage at the gate of transistor 242 of the second switching transistor circuit 240 increases and subsequently rises enough to turn on transistor 242. When the transistor 242 is on, current begins to flow from the drain to the source, which is filtered by capacitor 234 and provides the LDO 250 with energy stored within the internal inductance of transformer 205.

While the rectified voltage remains below the predetermined threshold, transistor 242 remains on and the internal inductance of the transformer 205 continues to provide the stored energy for the LDO 250. As the rectified voltage begins to rise above the predetermined threshold, transistor 224 begins to turn on while transistor 242 begins to turn off. Transistor 224 may turn on before transistor 242 turns off. When transistor 242 is off, the second switching transistor circuit 240 may experience inductive flyback from the internal inductance of the transformer 205. Those skilled in the art appreciate that when inductive flyback occurs, current being supplied by an inductive storage element may cause current to spike creating a spike in the voltage of the transformer. When the transistor 242 turns off, the internal inductance of the transformer 205 continues to supply energy into the second switching transistor circuit 240 for a brief period of time. The peak current and related peak voltage may be controlled by a voltage limiter. Without the voltage limiter, the voltage sourced by the internal inductance of the transformer 205 could rise significantly above the voltage rating of the capacitor 234 and the LDO 250. In one embodiment, a peak voltage limiter comprised of capacitor 236 and resistors 232 and 238 helps drain off the excess current created by the inductive flyback from the transformer 205. When transistor 242 turns off, excess current is drained through the capacitor 236 and resistor 232. In one embodiment, resistor 232 is a 20 kΩ ½ watt resistor and resistor 238 is a 2 kΩ ½ watt resistor, and capacitor 236 is a 1000 pF 35V capacitor.

Figure 3:
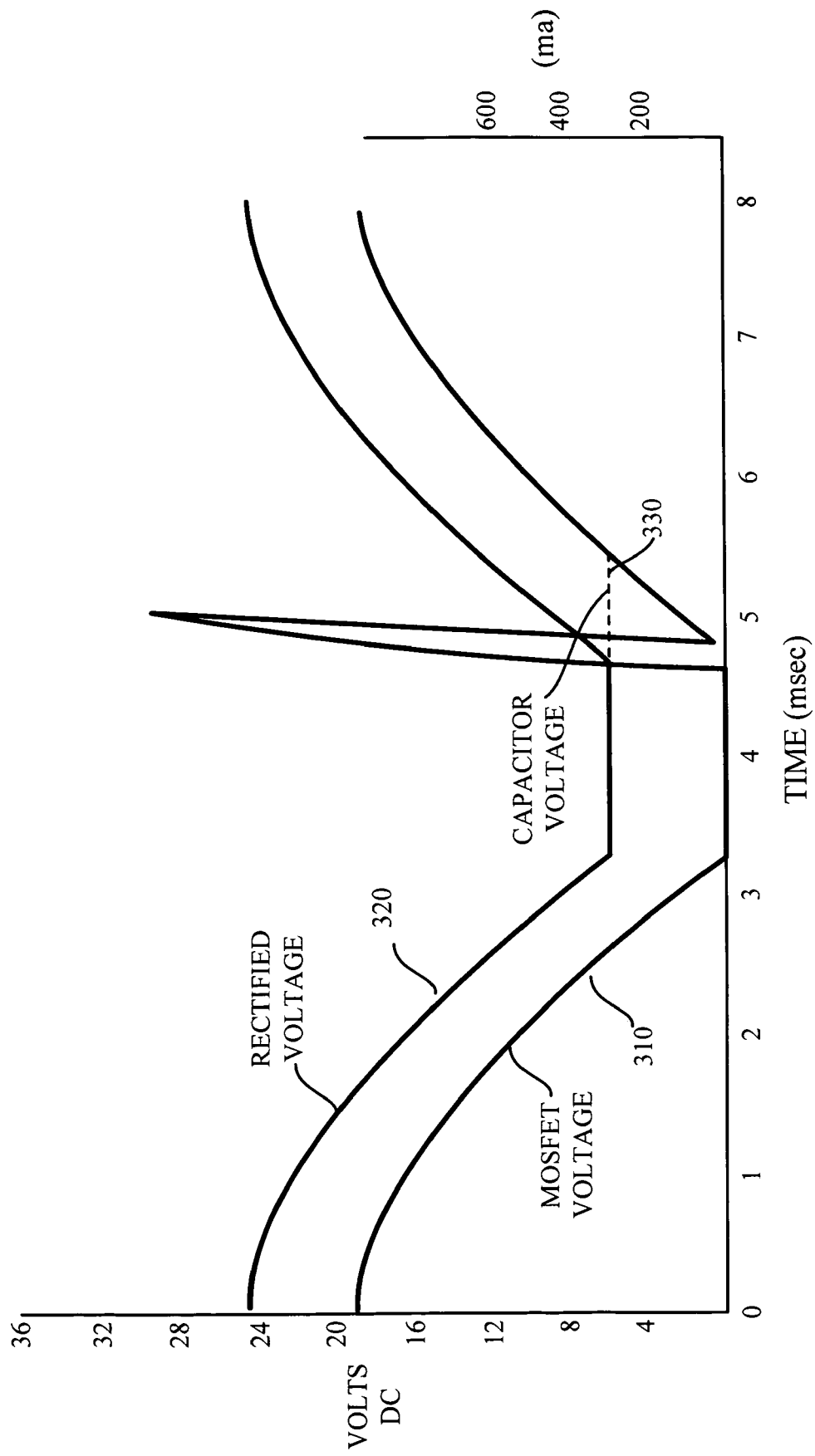
FIG. 3 displays an exemplary voltage waveform as measured in the DC power supply of FIG. 2.

To better understand the operation of the inventive concepts of the present invention FIG. 3 displays two voltage waveforms (310 and 320) measured in the power supply 140 when the power supply 140 receives a voltage of about 288 VAC at the primary winding of the transformer 205. Voltage waveform 310 is the output voltage of the diode bridge 210. Voltage waveform 320 is the voltage measured across the drain to source junction of the MOSFET 242. The difference between the voltage waveforms 310 and 320 is about 6.0 VDC which is the voltage across capacitor 234.

As can be seen in FIG. 3, at T=0, the voltage across the diode bridge is about 25 VDC, and the voltage across the transistor 242 is about 18VDC. At T=0, the MOSFET transistor 242 is off and the transistor 224 is on. As the rectified voltage 310 begins to decreases, and more specifically at about T=3.25 ms the rectified voltage drops below 6.0 VDC. At this point, the MOSFET 242 turns on and the transistor 228 turns off. During the time between T=3.25 ms to about 4.5 ms, the rectified voltage 320 is filtered by the capacitor 234. No current is flowing through the capacitor at this time since the rectified voltage 320 is equal to or less than the capacitor 234 voltage. This non-charge condition is maintained until the rectified voltage goes through zero and then increases to about 6.0 VDC after the zero crossover.

When the rectified voltage 310 increases to about 6.0 VDC at about 4.5 ms until about T=6.25 ms, the transformer secondary and more specifically the internal inductance of the transformer secondary delivers increasing current to charge the capacitor 234. Also during this time period, the rectified voltage 320 is equal to the voltage across the capacitor 234 and the balance of the rectified voltage 320 is dropped across the secondary impedance of the transformer 205.

At about T=6.25 ms, the MOSFET 242 begins to turn off. During the time it takes for the transistor 242 to turn off, the inductive flyback associated with the internal impedance of the transformer 205 causes the voltage 320 to spike. The voltage spike (the peak drain to source voltage) is limited by the rate of turn off of the gate voltage of the MOSFET 242. Once the MOSFET 242 has turned off, it remains off until the voltage 310 drops below about 6.0 VDC and the cycle repeats itself.

Figure 4:
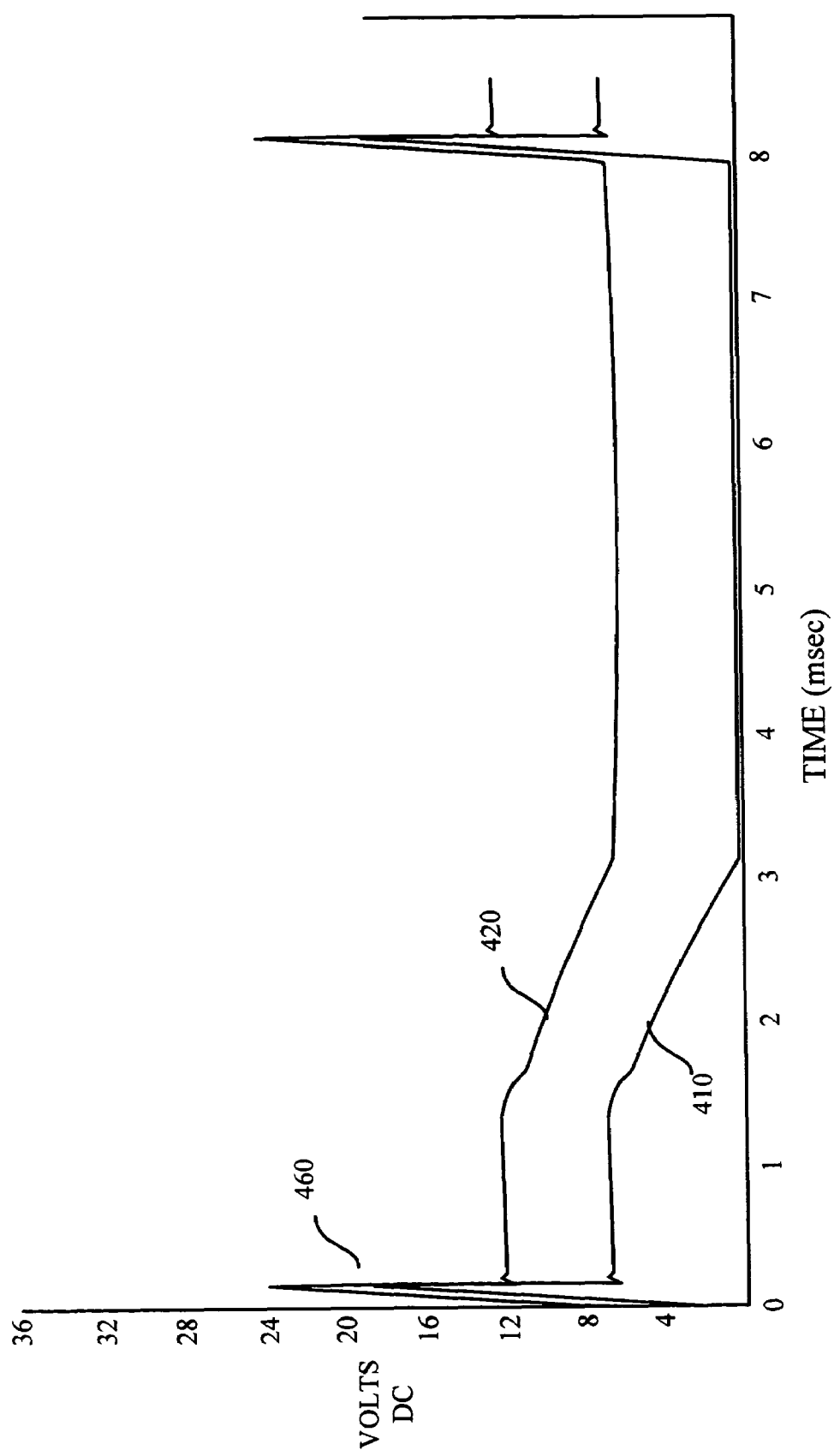
FIG. 4 displays another exemplary voltage waveform as measured in the DC power supply of FIG. 2.

As displayed in FIG. 3, capacitor voltage 330 remains at about 6.0 VDC until the MOSFET turns off and the capacitor voltage 330 spikes for a brief period of time. After the peak at about T=6.25 ms, the excess current is drained by the capacitor 236. After the excess current is drained, the power supply 140 returns to steady state where the capacitor 234 is charged to the 5.6V plus the base-emitter drop across transistor 228. As mentioned previously, any excess voltage from the fully rectified voltage outputted from the diode bridge 210 is dropped across the MOSFET 242 so at nominal AC input voltage the waveform across the MOSFET 242 is a series of truncated half wave pulses where the filter capacitor 234 delivers load current to the LDO 250 by itself. FIG. 4 displays two voltage waveforms 410 and 420 that may exist within the power supply 140 when the power supply receives about 104 VAC at the primary winding of the transformer 205. Voltage waveform 410 is the output voltage of the diode bridge 210. Voltage waveform 420 is the voltage measured across the drain to source junction of the MOSFET 242. The difference between the voltage waveforms 410 and 420 is about 6.0 VDC which is the voltage across capacitor 234.

As can be seen in FIG. 4, slightly after T=0, the transistors 242 and 228 have just completed a transition at 460. As shown in FIG. 4, the voltage waveform 410 is about 6V below voltage waveform 420. After the transition, the MOSFET transistor 242 is off and the transistor 228 is on. As the rectified voltage 420 begins to decreases, and more specifically at about T=3.25 ms the rectified voltage drops below 6.0 VDC. At this point, the MOSFET 242 turns on and the transistor 228 turns off. During the time between T=3.25 ms and the point where the rectified voltage returns to 6 VDC, the rectified voltage 420 is held up by the capacitor 234 and no current is flowing through the capacitor. When the rectified voltage increases above 6 VDC, charge current flows into capacitor 234.

When the capacitor voltage increases above 6.0 VDC at about T=8.0 ms, transistor 242 begins to turns off, the transformer secondary and more specifically the internal inductance of the transformer secondary delivers increasing voltage in an attempt to keep current flowing. The turn off rate selected for transistor 242 limits the peak voltage delivered by the transformer inductance.

The voltage spike (the peak drain to source voltage) is limited by the rate of turn off of the gate voltage of the MOSFET 242. Once the MOSFET 242 has turned off, it remains off until the voltage 420 drops below about 6.0 VDC and the cycle repeats itself.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A DC (direct current) power supply for a power meter comprising:
    a transformer, the transformer having an input and an output, the input receiving a first AC (alternating current) voltage waveform and converting the first AC voltage to a second AC voltage, the transformer also having an inductive portion, the output of the transformer coupled to;
    a diode bridge, the diode bridge rectifying the second ac voltage into a rectified AC voltage, the diode bridge coupled to;
    a first switching transistor circuit biased to turn on when the rectified AC voltage is greater than a first voltage threshold and turn off when the rectified AC voltage is less than the first voltage threshold;
    a second switching transistor circuit, the second switching transistor circuit biased to turn off when the rectified AC voltage is above the first voltage threshold and turn on when the rectified AC voltage is below the first voltage threshold; and,
    a switching regulator circuit, the switching regulator circuit providing a DC power source, the switching regulator circuit receiving energy from the inductive portion when the rectified AC voltage is below the first voltage threshold and the second transistor circuit is on.

2. The DC power supply of claim 1 wherein the first AC voltage waveform is less than about 280 VAC.

3. The DC power supply of claim 1 wherein the first AC voltage waveform is greater than about 70 VAC.

4. The DC power supply of claim 1 wherein the switching regulator receives energy as the inductive portion charges a capacitor.

5. The DC power supply of claim 1 wherein the first voltage threshold is about 6.0 VDC.

6. The DC power supply of claim 1 wherein the second switching transistor circuit further comprises a MOSFET (metal oxide semiconductor field effect transistor).

7. The DC power supply of claim 1 wherein the first switching transistor circuit further comprises a BJT (bipolar junction transistor).

8. The DC power supply of claim 1 wherein the DC power source is about 3.3 VDC.

9. A method for supplying a DC (direct current) power source for a power meter comprising:
    transforming a first AC voltage to a second AC voltage by a transformer, the transformer having an internal inductance,
    rectifying the second AC voltage into a rectified AC voltage by a rectifying circuit,
    receiving the rectified AC voltage at a first switching transistor circuit; and,
    receiving the rectified AC voltage at a second switching transistor circuit; and,
    receiving the rectified AC voltage at a switching regulator circuit,
    turning the first switching transistor circuit on and turning the second switching transistor circuit off when the rectified AC voltage transitions above a voltage threshold; and,
    turning the first switching transistor circuit off and turning the second switching transistor circuit on when the rectified AC voltage transitions below the voltage threshold; and,
    sourcing energy from the internal inductance into the switching regulator when the rectified voltage is below the voltage threshold.

10. The method of claim 9 wherein the first AC voltage is less than about 280 VAC.

11. The method of claim 9 wherein the first AC voltage is greater than about 70 VAC.

12. The method of claim 9 wherein the transformer's input to output ratio is about 11:1.

13. The method of claim 9 wherein the first voltage threshold is about 6.0 VDC.

14. The method of claim 9 wherein the second switching transistor circuit further comprises a MOSFET (metal oxide semiconductor field effect transistor).

15. The method of claim 9 wherein the first switching transistor circuit further comprises a BJT (bipolar junction transistor).

16. The method of claim 9 wherein the transformer receives a 50 HZ voltage signal.

17. The method of claim 9 wherein the sourcing energy from the internal inductance into the switching regulator further comprises the step of charging a capacitor.

18. A power meter for measuring energy consumption comprising:
    source voltage contacts;
    load voltage contacts;

a service disconnect switch interposed between the source voltage contacts and the load voltage contacts interrupting the flow of power from the source voltage contacts to the load voltage contacts when the service disconnect switch is in an open position; and, a DC (direct current) power supply coupled to the source voltage contacts, the DC power supply having a transformer, the transformer having an input and an output, the input receiving a first AC (alternating current) voltage waveform from the source voltage contacts and converting the first AC voltage to a second AC voltage, the transformer also having an inductive portion, the output of the transformer coupled to;

a diode bridge, the diode bridge rectifying the second ac voltage into a rectified AC voltage, the diode bridge coupled to;

a first switching transistor circuit biased to turn on when the rectified AC voltage is greater than a first voltage threshold and turn off when the rectified AC voltage is less than the first voltage threshold;

a second switching transistor circuit, the second switching transistor circuit biased to turn off when the rectified AC voltage is above the first voltage threshold and turn on when the rectified AC voltage is below the first voltage threshold; and, a switching regulator circuit, the switching regulator circuit providing a DC power source, the switching regulator circuit receiving energy from the inductive portion when the rectified AC voltage is below the first voltage threshold and the second transistor circuit is on.

19. The power meter of claim 18 wherein the first AC voltage waveform is less than about 280 VAC.

20. The power meter of claim 18 wherein the first AC voltage is greater than about 70 VAC.

21. The power meter of claim 18 wherein the transformer's operates at 60 HZ.

22. The power meter of claim 18 wherein the first voltage threshold is about 6.0 VDC.

23. The power meter of claim 18 wherein the second switching transistor circuit further comprises a MOSFET (metal oxide semiconductor field effect transistor).

24. The power meter of claim 18 wherein the first switching transistor circuit further comprises a BJT (bipolar junction transistor).

25. The power meter of claim 18 wherein the switching regulator receives energy as the inductive portion charges a capacitor.

\* \* \* \* \*